US011518142B2

(12) United States Patent
Height et al.

(10) Patent No.: US 11,518,142 B2
(45) Date of Patent: Dec. 6, 2022

(54) METHOD FOR MAKING POROUS GRAPHENE MEMBRANES AND MEMBRANES PRODUCED USING THE METHOD

(71) Applicants: ETH Zurich, Zurich (CH); HeiQ Materials AG, Schlieren (CH)

(72) Inventors: Murray Height, Newtown (AU); Hyung Gyu Park, Pohang (KR); Kyoungjun Choi, Thalwil (CH)

(73) Assignees: ETH Zurich, Zurich (CH); HeiQ Materials AG, Schlieren (CH)

(*) Notice: Subject to any disclaimer, the term of this patent is extended or adjusted under 35 U.S.C. 154(b) by 903 days.

(21) Appl. No.: 16/308,127

(22) PCT Filed: Jun. 9, 2017

(86) PCT No.: PCT/EP2017/064156
§ 371 (c)(1),
(2) Date: Dec. 7, 2018

(87) PCT Pub. No.: WO2017/212039
PCT Pub. Date: Dec. 14, 2017

(65) Prior Publication Data
US 2019/0168485 A1 Jun. 6, 2019

(30) Foreign Application Priority Data

Jun. 10, 2016 (EP) .................................. 16174017

(51) Int. Cl.
*B32B 9/00* (2006.01)
*B01D 71/02* (2006.01)
(Continued)

(52) U.S. Cl.
CPC ............ *B32B 9/007* (2013.01); *A41D 31/102* (2019.02); *B01D 67/0062* (2013.01);
(Continued)

(58) Field of Classification Search
CPC ....... Y10T 428/30; B32B 9/007; B82Y 30/00; C23C 16/26
(Continued)

(56) References Cited

U.S. PATENT DOCUMENTS 9,945,027 B2 * 4/2018 Farquhar ................ B32B 15/20
2012/0241069 A1 9/2012 Hofmann et al.
(Continued)

FOREIGN PATENT DOCUMENTS

CN 102583337 A 7/2012
CN 103241728 A 8/2013
(Continued)

OTHER PUBLICATIONS

Antonova et al., "Comparison of different methods of transferring the graphene and multigraphs grown by chemical vapor deposition on an insulating substrate SiO 2 / Si", Physics and Technology of Semiconductors, 2014, p. 827-832, Issue 6.

*Primary Examiner* — Daniel H Miller
(74) *Attorney, Agent, or Firm* — The Webb Law Firm (57) ABSTRACT

Method for making a porous graphene layer of a thickness of less than 100 nm with pores having an average size in the range of 5-900 nm, includes the following steps: providing a catalytically active substrate catalyzing graphene formation under chemical vapor deposition conditions, the catalytically active substrate in or on its surface being provided with a plurality of catalytically inactive domains having a size essentially corresponding to the size of the pores in the resultant porous graphene layer; chemical vapor deposition using a carbon source in the gas phase and formation of the porous graphene layer on the surface of the catalytically active substrate. The pores in the graphene layer are in situ formed due to the presence of the catalytically inactive domains.

42 Claims, 6 Drawing Sheets

(51) Int. Cl.
*C01B 32/186* (2017.01)
*A41D 31/102* (2019.01)
*B01D 67/00* (2006.01)
*B01D 69/10* (2006.01)
*B32B 9/04* (2006.01)
*C23C 16/26* (2006.01)
*H01L 21/02* (2006.01)
*H01L 29/16* (2006.01)
*B82Y 30/00* (2011.01)

(52) U.S. Cl.
CPC ......... *B01D 67/0072* (2013.01); *B01D 69/10* (2013.01); *B01D 71/021* (2013.01); *B32B 9/041* (2013.01); *C01B 32/186* (2017.08); *C23C 16/26* (2013.01); *B01D 2325/04* (2013.01); *B32B 2305/026* (2013.01); *B32B 2307/724* (2013.01); *B32B 2307/7265* (2013.01); *B32B 2437/00* (2013.01); *B32B 2457/00* (2013.01); *B82Y 30/00* (2013.01); *C01B 2204/04* (2013.01); *C01P 2006/16* (2013.01); *H01L 21/0262* (2013.01); *H01L 21/02425* (2013.01); *H01L 21/02527* (2013.01); *H01L 21/02642* (2013.01); *H01L 29/1606* (2013.01)

(58) Field of Classification Search
USPC .......................................................... 428/408
See application file for complete search history.

(56) References Cited

U.S. PATENT DOCUMENTS

| | | | |
|---|---|---|---|
| 2013/0160701 A1 | 6/2013 | Arnold et al. | |
| 2014/0151288 A1 | 6/2014 | Miller et al. | |
| 2015/0273401 A1 | 10/2015 | Miller et al. | |
| 2016/0019995 A1* | 1/2016 | Zhamu | H01B 13/30 |
| | | | 428/219 |

FOREIGN PATENT DOCUMENTS

| | | |
|---|---|---|
| CN | 104261403 A | 1/2015 |
| CN | 105647159 A | 6/2016 |
| EP | 2511002 A1 | 10/2012 |
| KR | 1020120081935 A | 7/2012 |
| TW | 201439359 A | 10/2014 |
| WO | 2014084860 A1 | 6/2014 |
| WO | 2015167145 A1 | 11/2015 |

* cited by examiner

METHOD FOR MAKING POROUS GRAPHENE MEMBRANES AND MEMBRANES PRODUCED USING THE METHOD

CROSS-REFERENCE TO RELATED APPLICATIONS

This application is the United States national phase of International Application No. PCT/EP2017/064156 filed Jun. 9, 2017, and claims priority to European Patent Application No. 16174017.0 filed Jun. 10, 2016, the disclosures of which are hereby incorporated in their entirety by reference.

BACKGROUND OF THE INVENTION

Field of the Invention

The present invention relates to a method for producing porous ('holey') graphene membranes that are waterproof yet highly breathable due to enhanced vapor transmission through the pores perforated within graphene layers. Furthermore it relates to graphene membranes made using the method and uses of such membranes.

Description of Related Art

Waterproof membranes used in outdoor apparel are effective against high liquid static pressures (rain penetration resistance), however in general they suffer from low vapor permeability to allow sufficient moisture vapor transport, breathability of the garments and user comfort.

Highly breathable membranes are also relevant to various technical textile applications including military uniforms for chemical protection, emergency responder uniforms, protective gloves and outdoor electronic circuit protective packaging. Membranes offering high efflux rates and/or selectivity also have a wide range of potential applications in separations and energy applications. They would also spark on many other potential areas of applications, unseen for the present absence of highly breathable membranes.

While GoreTex® is dominant in the waterproof membrane market, there are numerous alternative membrane providers manufacturing membranes from various polymers besides PTFE such as polyamide and polyurethanes. In each case the membranes consist of a polymer film with small pores to enable passage of water vapor. The thickness of conventional membranes and limitations on pore area density limits the magnitude of vapor transport.

One proposed replacement material for applications where high vapor transmission and water sealing properties are required is porous graphene. Graphene, a two-dimensional, single-layer sheet of $sp^2$ hybridized carbon atoms, has attracted world-wide attention and research interest, owing to its exceptional physical properties, including high electronic conductivity, thermal stability, and mechanical strength. The use of porous graphene membranes in fabric laminate structures has been proposed in the following documents:

WO-A-2014084860 generally describes the fixation of a porous graphene layer onto a fibrous substrate backing. The patent describes the laminate assembly together with methods for constructing and assembling the laminate. The patent does not describe the method used to form the porous graphene layer.

US-A-2015273401 expands on the method described in WO-A-2014084860 with an assembly of porous graphene membrane on a fabric substrate together with inclusion of selective membrane layers on side of the graphene layer. The making of porous graphene membrane material is sketched to involve the growing of a contiguous monolayer and perforating the layer and a subsequent step.

Aspects relevant to the present invention in relation with porous graphene and its various production methods can be summarized as follows as categories and sub-categories.

Category 1: Post-Synthesis Formation of Porous Graphene—Serial Processes

Post-synthesis formation involves perforating holes in a contiguous graphene layer which has been synthesized in a prior step. Serial processes involve hole-by-hole fabrication of the porous graphene layer. This is a slow process that offers minimal utility for scale-up production of porous membranes.

Category 1.1: Nitrogen Assisted e-Beam Perforation

Scanning electron microscope (SEM) imaging in presence of nitrogen gas can be used to induce a localized reactive ion etching process by ionizing the nitrogen molecules with the focused electron beam of the SEM. With this approach, pores down to 10 nm can be etched into multilayer graphene (less than 10 layers). However nitrogen ion diffusion out of the region of electron beam focus causes pores to etch outside of the region of interest questioning this approach to yield dense arrays of small pores. Additionally, use of the SEM makes it a serial pore milling process, which is difficult to scale up.

Category 1.2: FIB & Unfocused e-Beam Patterning

In this two-step process, first 3 keV, Ar+ focused ion-beam (FIB) is used to create one- and two-atomic defects into a graphene monolayer which needs to be cooled to 148K to obtain the desired defect sizes. Next, an unfocused electron beam with 80 keV is used to grow the defects from the pore fringe, while leaving the non-defected graphene parts unaffected enabling down to 0.6 nm diameter pore creation.

Alternatively, focused ion beams using either Ga+ or He+ ions can be used to create pores from 1000 nm to sub-10 nm in size. The process enables control over the pore size, pore density, and pore arrangement, however due to the serial nature of the milling, scale-up remains difficult. Also, milling of sub-5 nm pores is challenging.

The method as disclosed in WO-A-2015167145 discloses a graphene membrane and a method for manufacturing the same. The graphene membrane includes a graphene layer having a porous pattern including a plurality of pores having a size of 5 to 100 nm and a supporter configured to support the graphene layer and including a plurality of pores having a greater size than the pores of the graphene layer. The proposed method involves the formation of block copolymer domains on the graphene surface to form a mask template. Subsequent exposure to ion beam irradiation is used to etch pores into the graphene layer.

Category 1.3: TEM Based Methods

In order to measure the translocation of DNA through graphene nanopores, free-standing graphene can be perforated by a 300 kV acceleration voltage electron beam in a transmission electron microscope (TEM). Mono- and multilayer graphene can be patterned with pores ranging from 2 nm-40 nm. No amorphization is observed in the vicinity around the pore, indicating that the crystallinity is preserved. This method is however not parallel and takes quite some time.

Category 2: Post-Synthesis Formation of Porous Graphene—Parallel Processes

Post-synthesis formation involves perforating holes in a contiguous graphene layer which has been synthesized in a prior step. Parallel processing involves perforating the graphene layer in multiple locations at the same time.

Category 2.1: Ultraviolet-Induced Oxidative Etching

UV-etches are performed to create sub-nm defects into graphene, which grow upon prolonged exposure. Repeating 15 etches with 1 min exposure to a bilayer graphene membrane e.g. yield pores that show size selective sieving of $SF_6$ which has a kinetic diameter of 4.9 Å.

Category 2.2: Ion Bombardment & Oxidative Etching

Ga+ ions with 8 keV can be accelerated at the graphene surface with 52° angle of incidence creating defects into the graphene lattice. Subsequently, the graphene defects can be etched using acidic potassium permanganate to etch unsaturated carbon bonds and thus enlarge the pore until a stabilization at 0.4 nm pore diameter after 60 min etch time occurs, which is thought to originate from formation of functional groups inhibiting a further growth reaction.

Category 2.3: Oxygen Plasma

Sub-nm pores can be created by exposing suspended monolayer graphene to 1 s-6 s of oxygen plasma etch (20 W), where the etch time determines the pore size and density. Pore sizes of 0.5-1 nm at a pore density of 1 pore/100 $nm^2$ can be achieved with 1.5 s exposure to the plasma.

Category 2.4: Strain-Assisted Pt Nanoparticle Perforation

Self-assembly of block copolymer (BCP) micelles containing Pt precursor leads to distributed Pt nanoparticles across a substrate onto which a graphene monolayer produced before can be transferred such that perforation is obtained after annealing at 400° C. Catalytic perforation of graphene is facilitated due to localized strain at the Pt nanoparticles. The pore size and density can be controlled with the micelle composition leading down to 17 nm pores at 12.8% porosity. Large scale perforation in theory should be possible, however obtaining a uniform dispersion of Pt precursors is challenging and the largest areas shown are ca. 4 $\mu m^2$.

Category 2.5: Perforation Using Catalytic Oxidation in Contact with Metal Particles KR-A-20120081935 and KR-A-101325575 propose to apply a thin metal film layer (Au or Ag) deposited onto surface of an existing graphene layer followed by an annealing step to form metal particle domains on the graphene surface. Further thermal steps lead to formation of pores at the contact to the metal domains via a catalytic oxidation.

Category 2.6: Using Anodic Alumina as Template

Graphene on a substrate can be patterned using an anodic alumina membrane. The anodic alumina is placed with the small pore side facing the existing contiguous graphene substrate and a plasma exposure removes the graphene if not protected by the aluminum. The resulting pore size is 40 nm-60 nm.

Category 3: Formation of Porous Graphene Membranes from Graphene Platelets

Porous membranes of graphitic layers may alternatively be formed through the assembly of films composed of graphene (or graphene oxide) platelets. The platelets in principle form a laminar structure with pores forming between the platelet boundaries. The graphene platelet approach tends to form relatively thick layers that do not fully exploit the inherent two-dimensional planar geometry of graphene.

Category 3.1: Pore Template During Film Formation

CN-A-104261403 describes a preparation method for graphene film with a three-dimensional porous structure. Polystyrene domains are used as a sacrificial template for pore formation within a film layer formed from graphene oxide platelets as starting material.

Category 4: Direct Synthesis of Porous Graphene Membranes

Direct synthesis of porous graphene membranes involves the simultaneous formation of graphene layer(s) that directly form porous features in the graphene layer. Direct synthesis methods avoid the need for post-synthesis processing to achieve the porous structure.

Category 4.1: Pores Due to Grain Boundary Defects

EP-A-2511002 proposes the growth of a graphene layer on an untreated copper substrate. The monolayer is subsequently solution coated with PMMA and then immersed in an etchant to remove the copper. The PMMA-layer carrying the graphene layer was attached to a PTMSP film and the PMMA layer removed using a solvent. In the resultant graphene layer a plurality of grains of graphene is present with pores as defects between the graphene grains. The patent describes the membrane properties for separation of various substances from liquids and gases.

Category 4.2: Template Patterning of Carbon Source Followed by Graphene Layer Formation CN-A-103241728 provides a method for preparing a graphene nanopore array, which comprises the following steps: 1) coating a carbon source solution on the surface of a porous anodic alumina (PAA) template; 2) pressing the PAA template with the carbon source coated on the surface of a metal base, peeling the PAA template, and ensuring that the carbon source is preserved on the surface of the metal base and the carbon source preserves a pattern which is consistent with that on the surface of the PAA template; and 3) performing annealing treatment on the obtained metal base in the presence of a mixed gas flow of hydrogen gas and argon gas, thus converting the carbon source into the graphene nanopore array. The nanopore array obtained by the invention is an interconnected nanopore array structure rather than a single nanopore or several nanopores; and the pore size of the nanopores can be regulated through the template effect of the PAA itself, and can be further regulated through growing and etching in the later stage.

TW-A-201439359 describes a method for forming a large-area graphene layer on a porous substrate by a chemical vapor deposition process. In a first step carbon material is deposited onto a porous template using CVD. In a second step the carbon material undergoes annealing and catalytic graphitization to convert the carbon to a graphene layer. In a third step liquid exfoliation is used to reduce the number of graphene layers on the substrate.

Category 4.3: Direct Growth of Porous Graphene Using Porous Templates and Patterns CN-A-102583337 describes a preparation method for graphene material with porous structure. Porous magnesium oxide/silicon composite material is used as a template substrate. Chemical Vapor Deposition (CVD) is used to grow graphene directly on the porous template. The graphene layer retains the porous structure of the template substrate. The porous graphene layer is recovered by destructive etching of the magnesium oxide/silicon composite substrate.

US-A-2012241069 discloses how a graphene pattern is fabricated by forming a pattern of passivation material on a growth substrate. The pattern of passivation material defines an inverse pattern of exposed surface on the growth substrate. A carbon-containing gas is supplied to the inverse pattern of the exposed surface of the growth substrate, and patterned graphene is formed from the carbon. The passivation material does not facilitate graphene growth, while the inverse pattern of exposed surface of the growth substrate facilitates graphene growth.

US-A-2013160701 proposes methods for growing microstructured and nanostructured graphene by growing the microstructured and nanostructured graphene from the bottom-up directly in the desired pattern. The graphene structures can be grown via chemical vapor deposition (CVD) on substrates that are partially covered by a patterned graphene growth barrier which guides the growth of the graphene.

In summary, the existing technology for the waterproof breathable membranes can be improved and there exists room for improvement and needs for breakthrough technology to gain vapor breathability (rapid moisture removal) while maintaining the liquid barrier properties, for the sake of customer comfort and protection of materials beneath the garment or packaging. Porous graphene membranes have been proposed for such applications, and also have been analyzed and compared with conventional breathable membranes and have been shown to exhibit better breathability, but the existing processes for making suitable porous graphene membranes are not suitable for upscaling and industrial processes.

SUMMARY OF THE INVENTION

It is therefore an object of the present invention to provide an improved method for making porous graphene membranes, in particular a method allowing to achieve a controllable low membrane layer thickness and to achieve a controllable pore size and good mechanical properties of the graphene membrane. Furthermore the method shall be industrially applicable for large-scale production.

Current membranes used in outdoor apparel are effective against high liquid static pressures (rain penetration resistance), however they suffer from poor breathability of the garments and customer discomfort associated primarily with insufficient vapor permeability. It is recognized that there exists a substantial driving force towards breakthrough innovation in the waterproof-yet-breathable apparel market, particularly in the direction of improvement of moisture vapor removal. Thus, technical problems that call for solutions are:
  to maintain the textile waterproof property;
  to augment transpiration across the waterproof layer of the textile; and
  to design a cost-efficient manufacturing process.

The technical solution to the above problems is the provision of a method to produce a graphene based porous hydrophobic layer that repels liquid droplets, e.g. water droplets, through a capillary action while permitting vapor transmission at a rate far higher than those of conventional membranes. Manufacturing of this membrane component as proposed is facile, fast and cost-efficient, for instance by synthesizing porous graphene without an additional post-synthesis perforation process. The synthesis method of this material allows for batch or continuous processes.

The invention thus addresses vapor transmission enhancement by use of porous graphene. Porous graphene is a graphene layer having pores where graphene material is locally absent within the plane of the graphene layer. It is the atomically thin, hydrophobic and mechanically resilient graphene that allows vapor transmission at a greatly enhanced rate while blocking liquid water permeation, if pores are in the range favorable for capillarity. There exists a tradeoff in the pore sizes: the larger the pores, the faster the water vapor transmission yet with an increased likelihood of liquid water leakage. Hence, the target pore sizes of this invention bracket 5-900 nm. Because the phase-selective transport mechanism is based on the surface tension at the solid-liquid-gas interface yet not on the transporting molecules' own sizes, a wide range of pore sizes are allowed in a mixed way, thereby facilitating and widening the manufacturing options.

The proposed one-step synthesis method of porous graphene by use of a sparsely inactivated catalyst (or pore-domain-patterned copper) foil is advantageous, for it gets rid of an additional post-synthesis perforation step, thereby increasing operational efficiency.

Process design of the porous graphene detachment from the catalyst layer aims to recycle the catalyst and substrate.

Design of a continuous process for manufacturing porous graphene is advantageous to most of the state-of-the-art fabrication methods in that it is potentially close to a marketable manufacturing option.

Generally speaking, therefore, the present invention relates to a method for making a porous graphene layer of a thickness of less than 100 nm, preferably less than 50 nm or less than 20 nm, and more preferably less than 10 nm with pores having an average size in the range of 5-900 nm, comprising the following steps:
  providing a catalytically active substrate catalyzing graphene formation under chemical vapor deposition conditions, said catalytically active substrate in or on its surface being provided with a plurality of catalytically inactive domains having a size essentially corresponding to the size of the pores in the resultant porous graphene layer (essentially corresponding to the size of the pores means that the catalytically inactive domains have a size which is equal to the size of the resulting pores ±20%, preferably ±10%, and most preferably ±5% or ±3%);
  chemical vapor deposition using a carbon source in the gas phase and formation of the porous graphene layer on the surface of the catalytically active substrate, the pores in the graphene layer in situ being formed due to the presence of the catalytically inactive domains.

The graphene layer can be a monolayer having a typical thickness in the range of 0.35 nm but it can also be a structure having several layers, typically up to 5, or up to 10 layers. Preferably the layer thickness is therefore in the range of less than 8 nm, preferably less than 5 nm, or less than 2 nm.

The average size of the pores is in the range of 5-900 nm. Also the size distribution is typically monomodal or bimodal, normally monomodal and narrow. Typically the full width of the corresponding distribution of pore sizes at half the maximum frequency is less than 50% or 30% of the average pore size. Preferably the size of the pores is in the range of 10-800 nm, most preferably in the range of 10-500 nm or 20-100 nm.

A high density of pores is possible, according to a preferred embodiment there are in the range of $0.1-100 \times 10^{10}$ cm$^{-2}$, preferably in the range of $0.5-150 \times 10^{10}$ pores or $1-10 \times 10^{10}$ pores per square centimeter.

In the step of chemical vapor deposition preferably the following conditions are used:
  the carbon source, preferably hydrocarbons, e.g. saturated or unsaturated hydrocarbons including methane, ethane, ethylene, acetylene and mixtures thereof, is provided preferably as a flow mixture of hydrocarbon and hydrogen at a volumetric ratio of 1-1000 parts hydrocarbon per part of hydrogen, preferably 600-800, 1-20, or 1-10, or 2-7. The hydrocarbon and hydrogen gases may be further mixed with a (inert) carrier gas such as argon or nitrogen. The overall pressure is preferably maintained in the range of 10-100000 Pa, preferably in the range of 10-200 Pa or 20-150 Pa or 80-120 Pa. Alternatively, the carbon source, preferably hydrocarbons, e.g. saturated or unsaturated hydrocarbons including methane, ethane, ethylene, acetylene and mixtures thereof, is provided as a flow mixture of 1-20 vol-% hydrocarbon in hydrogen, preferably 1-10 or 2-7 vol-%, at an overall pressure in the range of 10-200 Pa, preferably in the range of 20-150 Pa or 80-120 Pa. The CVD process is preferably carried out at a temperature in the range of 300-1200° C., in particular in the range of 300-900, 500-800 or 500-1000° C., for a time span in the range of 1-12 hours preferably in the range of 2-4 hours.

The proposed method shows the following differences with respect to the state of the art as discussed above:

Unlike category 1 (Post-synthesis formation of porous graphene—Serial processes) the present invention describes a method that involves the synthesis of graphene with direct formation of pore features within the layer rather than the post-synthesis formation of pores using various serial-mode perforation methods. Serial methods are time-consuming and inherently difficult to scale and so the present invention offers clear advantages for industrialization.

Unlike category 2 (Post-synthesis formation of porous graphene—Parallel processes) the present invention describes a method that involves the synthesis of graphene with direct formation of pore features within the layer rather than the post-synthesis formation of pores using various parallel-mode perforation methods. By avoiding the need for time-consuming post-processing, the present invention is more efficient than the category 2 methods.

Unlike category 3 (Formation of porous graphene membranes from graphene platelets) the present invention does not use graphene (or graphene oxide) platelets as building block components to form a graphene-containing film. The present invention involves the direct synthesis of porous graphene which offers minimal membrane thickness in comparison to the relatively thick film-layer of the methods in category 3. Thinner porous layers generally provide less resistance to vapor transmission.

Unlike category 4.1 (direct synthesis—pores due to grain boundary defects) where pores are formed passively between graphene grain boundaries, the present invention uses a template approach to provide greater control of the pore size and density characteristics of the formed pores. The present invention provides greater consistency of porous characteristics and also more favorable porosity.

Unlike category 4.2 (direct synthesis template patterning of carbon source followed by graphene layer formation) where a deposited carbon layer with porous features (due to a porous substrate template) is converted into a graphitic layer, the present invention involves direct formation of a graphene layer in a single step. Furthermore in the present invention pore features form due to presence of catalytically inactive metallic domains whereas the category 4.2 methods involve a porous substrate. The present invention offers greater control of substrate properties and finer control of pore dimensions.

Unlike category 4.3 (Direct growth of porous graphene using porous templates and patterns) where a porous substrate is used for direct growth of porous graphene, the present invention uses catalytically inactive metallic domains in or on the substrate surface in order to generate the pore features in the graphene layer. Unlike the category 4.3 methods, the growth substrate can be re-used rather than destroyed during the removal of the graphene layer.

The objective of this invention is to provide a method of producing porous ('holey') graphene membranes that are waterproof yet highly breathable by enhancing vapor transmission through the pores perforated on graphene layers. This method comprises one or a combination of the following aspects:

(i) one-step synthesis of porous graphene on a recyclable substrate, continuous or batch,
(ii) transfer of the porous graphene with preserving the substrate,
(iii) a way how to recycle the substrate,
(iv) use of the porous graphene membranes in combination with fabrics to achieve waterproof apparel with greatly enhanced vapor transmission in comparison to conventional membranes.

As a result, ultimate vapor transmission is enabled by use of ultrathin, porous graphene. The one-step synthesis of porous graphene, continuous or batch, provides for a process intensification concept. Resource-sustainable manufacturability is made available by recycling the pore-domain-patterned catalyst substrates. The method allows the conversion of vapor-transmitting porous graphene to waterproof-yet-breathable textile. A continuous manufacturing process is made available for producing the porous graphene sheets.

According to a preferred embodiment, the method is carried out as follows:

1. Deposit dopant metal (catalytically inactive domain forming material) onto catalytically active material (e.g., copper) substrate;
2. Thermal annealing step to grow controlled dopant particle domains on catalytically active (copper) surface, preferably under reducing conditions using preferably hydrogen gas in an inert gas;
3. Grow graphene on catalytically active (e.g., copper) metal substrate using chemical vapor deposition process. Graphene forms porous voids where dopant metal particles are located.
4. Removal of the graphene layer with leaving the locally inactivated catalyst substrate for re-use.
5. Fixing the porous graphene layer to laminate fabric substrates to form a water repellent membrane assembly (optional).

According to a preferred embodiment, the catalytically active substrate with the plurality of catalytically inactive domains prior to the step of chemical vapor deposition is subjected to a step of thermal annealing and/or reduction in (preferably dry) hydrogen. When talking about "dry hydrogen" this means that the hydrogen gas used should preferably not contain more than 1 vol-%, more preferably not more than 0.1 vol-%, and most preferably not more than 0.01 vol-%, or 0.001, 0.0001 or. 0.00001 vol-% of water (taking the hydrogen gas as 100%). Typically the conditions for this annealing are chosen to be as follows: 50-90 vol-%, preferably 70-80 vol-% $H_2$ mixed in a noble or inactive gas, preferably Ar, He and Ne or $N_2$, at a pressure in the range of 10-100000 Pa, preferably 10-100 Pa, and more preferably 30-50 Pa, for a time span in the range of 30-120 minutes, preferably in the range of 60-90 minutes.

Said catalytically active substrate with a plurality of catalytically inactive domains can be produced by spraying or physical vapor deposition, in particular sputtering, e-beam evaporation or particle spraying, of a catalytically inactive material or of a material catalytically inactivating the substrate and subsequent thermal annealing to form the plurality of catalytically inactive domains.

According to a preferred embodiment the step of chemical vapor deposition using a carbon source in the gas phase is carried out by using hydrocarbons, preferably selected from the group consisting of methane, ethane, ethylene, acetylene and mixtures thereof. Preferably these gases are used in a concentration of 1-20 vol-% mixed preferably with hydrogen forming the rest of the gas phase. Preferably the gas phase is maintained at an overall pressure in the range of 10-10000 Pa, preferably in the range of 10-200 Pa or 20-150 Pa or 80-120 Pa. According to a preferred embodiment, the chemical vapor deposition process is carried out at a temperature above 300° C., preferably in the range of 300-1200° C., in the range of 500-1000° C. or in the range of 500-900° C. or 500-800° C. Typically the deposition process is carried out for a time span in the range of 1-12 hours, preferably in the range of 2-4 hours, most preferably in the range of 2-3 hours.

According to a particularly preferred embodiment, in the step of chemical vapor deposition the following conditions are used: the carbon source, preferably chosen to be hydrocarbons and in particular saturated or unsaturated hydrocarbons, including methane, ethane, ethylene, acetylene and mixtures thereof, is used at 1-20 vol-% in concentration mixed with hydrogen at an overall pressure in the range of 10-10000 Pa, preferably in the range of 10-200 or 20-150 Pa or 80-120 Pa, wherein the CVD process is preferably carried out at a temperature in the range of 300-1200° C., in particular in the range of 500-1000° C. for a time span in the range of 1-12 hours preferably in the range of 2-4 hours.

According to yet another preferred embodiment, for the making of the substrate on a catalytically active substrate, preferably a copper foil (or another catalytically active material as given further below), a preferably contiguous metal layer is produced using a metal which is not catalytically active, preferably selected from the group consisting of: molybdenum, tungsten, gold, silver, zirconium, niobium, chromium, or a combination thereof, preferably selected as tungsten. According to a preferred embodiment, such a preferably contiguous layer of metal which is not catalytically active is 1-10 nm thick is in a first step produced via physical vapor deposition at a chamber pressure in the range from $2.0\times10^{-5}$ to $3.0\times10^{-4}$ Pa, wherein preferably a deposition rate in the range of 0.01-1.0 Å/s is used.

Preferably in a subsequent step this metal layer undergoes thermal annealing under reducing conditions, preferably using hydrogen gas atmosphere, and elevated temperatures in the range of at least 900° C., to generate the essentially random catalytically inactive domains in a surface migration/agglomeration process. Preferably this annealing is carried out for a time span in the range of 30-120 minutes and using hydrogen gas in an inert gas in a proportion of at least 50 vol-%.

According to a particularly preferred embodiment, for the making of the substrate on a catalytically active substrate, preferably a copper foil, a metal layer is produced using a metal which is not catalytically active, preferably tungsten, wherein preferably such a preferably contiguous layer which is 1-10 nm thick is in a first step produced via physical vapor deposition at a chamber pressure in the range from $2.0\times10^{-5}$ to $3.0\times10^{-4}$ Pa, wherein preferably a deposition rate in the range of 0.01-1.0 Å/s is used.

Preferably, then after the pressure is lowered to baseline values at or below 0.0002 Pa the pressure is preferably adjusted to, preferably in the range of 10-100 Pa, and the substrate is first heated to a temperature in the range of 900-1200° C., preferably in the range of 950-1100° C., to anneal in a chemically reducing environment, preferably in the presence of hydrogen gas and/ammonia gas, preferably 50-90 vol-% hydrogen in a noble or inactive carrier gas, for a time span in the range of 30-120 minutes, preferably in the range of 60-90 minutes.

Preferably, on a catalytically active substrate, preferably a copper foil, a metal layer is produced of a metal which is not catalytically active, preferably tungsten. Such a contiguous layer can in a first step be produced which is 1-10 nm thick at a low chamber pressure in the range from $2.0\times10^{-5}$ to $3.0\times10^{-4}$ Pa. Preferably a low deposition rate is used, for example in the range of 0.01-1.0 Å/s. Then the pressure can be further reduced, e.g., to values below 0.0002 Pa, and the substrate can be first heated to a temperature in the range of 900-1200° C., preferably in the range of 950-1100° C., to anneal and by then applying the following reducing conditions: 50-90 vol-%, preferably 70-85 vol-% $H_2$ mixed in an inert, preferably noble or inactive gas, preferably Ar or $N_2$, at a pressure in the range of 10-100 Pa, preferably 30-50 Pa, normally at a temperature in the range of 900-1200° C., preferably 950-1100° C., for a time span in the range of 30-120 minutes, preferably in the range of 60-90 minutes. During annealing, thermally induced surface phenomena such as migration, agglomeration, and Ostwald ripening contribute to converting the catalytically inactive thin film into nanoparticles on top of the catalytically active substrate.

The catalytically active substrate, according to a preferred embodiment, is a copper substrate, and the catalytically inactive domains are due to the presence of a metal different from copper in said domains. Instead of copper or in addition to copper another catalytically active transition metal can be employed as the material for the catalytically active substrate.

According to a preferred embodiment, the material forming the catalytically active substrate is selected from the following elemental metals: Cu, Ni, Pt, Ru, Ir, Rh or a combination thereof. Preferably the metal different from copper, or more generally speaking, different from the material of the catalytically active substrate, is selected from the group of metals consisting of molybdenum, tungsten, gold, silver, zirconium, chromium, niobium or a mixture/alloy thereof. Also possible is the use of corresponding metal oxide systems, further possible is the coating of the catalyst substrate by or spraying of aluminum oxide particles forming the catalytically inactive domains.

It is to be noted that when talking about a catalytically active substrate and catalytically inactive domains these terms are to be interpreted in a relative manner. The materials forming the catalytically inactive domains may, if used under certain specific circumstances and if provided in the corresponding form (for example elemental metal form) also to a certain extent act as a catalyst for graphene formation. However, the catalytic activity of the inactive domains is much smaller than that of the catalytically active substrate material. Catalytic activity is always dependent on the form of the corresponding material and on the conditions under which the catalytic (graphene forming) activity would be achieved. Furthermore, it depends on the presence or absence of adjacent regions having a different catalytic activity. According to the present invention and according to a preferred embodiment for example copper is used as the catalytically active support to facilitate graphene growth under the chosen process conditions (hence 'catalytic' behavior) and using those same process conditions the other metal (e.g., W) shows relatively lower propensity to form graphene and therefore exhibits apparent 'non-catalytic' behavior. This differential behavior is sufficient to allow the formation of the pores in the process as proposed.

The behavior of the metals is therefore dependent on the context of the growth conditions and the other materials that are used in the system at the same time. Catalytic and non-catalytic are therefore not absolute terms and to a certain extent rely on the context about the specific process.

According to yet another preferred embodiment, the catalytically inactive domains have an average size in the range between 5 nm and 900 nm or preferably 10 nm and 100 nm, more preferably in the range of 10-50 nm.

Subsequent to the chemical vapor deposition of the porous graphene layer, according to a further preferred embodiment the porous graphene layer is removed from the substrate for further handling and use. This removal can be effected using a mechanical and/or electrochemical method, particularly preferably via van der Waals peeling, electrochemical delamination, or disengagement by ultrasonic actuation, and is then applied to another substrate.

The delaminated porous graphene layer can for example subsequently be attached to a water and vapor permeable textile substrate for uses such as clothing, or other technical fields where liquid (e.g., water) is to be repelled and vapor is to be transmitted and/or to facilitate post-processing and handling of the porous graphene membrane layer(s).

The substrate with the catalytically inactive domains can be reused for a next manufacturing process of porous graphene layer, and the process can be a continuous or a batch process. Furthermore, the present invention relates to the use of a porous graphene layer produced using a method as given above as a waterproof and highly breathable membrane for textile applications. Further applications of the proposed porous graphene layer are as follows: water barrier membranes in particular for electronics including cell phones and handheld devices; pressure equalizer membranes for electronic devices; filters; gas separation membranes; electronic components for conductive, semi-conductive and/or electricity generating applications.

Furthermore, the present invention relates to a porous graphene layer as produced using a method as described above, with a thickness of less than 100 nm and with pores having an average size in the range of 5-900 nm, in particular for use as a waterproof and highly breathable membrane for textile applications as well as water barrier membranes in particular for electronics including cell phones and handheld devices; filters; gas separation membranes; electronic component for conductive, semi-conductive and/or electricity generating applications.

The nature of the pores as produced according to the present method is different from the ones produced by hole drilling using conventional methods. The produced pores are more robust due to the edge lattice structure. Also, the establishment of a more variable hole size distribution is possible that provides for improved pore packing and areal density. Furthermore, the nature of the graphene using the new method is different. There are stronger sections between holes due to less stray bombardment from the tunneling beam (e.g., energetic ions).

Hence, in summary, a method for producing porous graphene membranes for waterproof-yet-highly-breathable textiles is proposed. The porous graphene layers for waterproof-yet-highly-breathable membrane can be formed through one-step synthesis on a catalyst substrate pre-patterned for generation of pores. Size of the pores can lie between 5 nm and 900 nm.

The catalyst substrate pre-patterned for pores of to-be-grown graphene can be copper foils and films which are sparsely coated with submicrometer-sized particles of catalytically inactive material such as molybdenum, tungsten, gold or other suitable metals.

The catalyst substrate pre-patterned for pores of to-be-grown graphene can be copper foils and films which feature a template pattern of etched cavities filled with submicrometer-sized domains of catalytically inactive material such as molybdenum, tungsten, gold or other suitable metals.

Water vapor transmission rate across the porous graphene layer(s) can be higher than commercially existing textile membrane films by 1 or more orders of magnitude.

The porous graphene atop pore-patterned catalyst substrate can be detached from the substrate by mechanical, chemical, and electrochemical methods, thereby allowing for reuse of the catalyst substrate for subsequent cycles of porous graphene membrane growth. These mechanical electrochemical methods can include sonication, thermal responsive tape, pressure sensitive tape, thermal expansion mismatching, water-splitting-based bubbling, and surfactant-assisted knife slicing. Any mixture of these methods, and the similar methods to them, are possible.

The one-step growth and the mechanical electrochemical detachment of the porous graphene can be processed in a batch process or in a continuous process.

For a batch process or a continuous process, a spray coating and subsequent thermal annealing of liquid carbon feedstock can form porous few-layer graphene on the pore-patterned catalyst substrate in a facile and economic fashion. Also for a batch process or a continuous process, a mechanical electrochemical method can detach the porous graphene from the catalyst substrate while both preserving the graphene layer integrity and re-use of the substrate.

Waterproof yet highly breathable assemblies featuring porous graphene membrane components derived from the process are also the object of the present invention.

Further embodiments of the invention are laid down in the dependent claims.

BRIEF DESCRIPTION OF THE DRAWINGS

Preferred embodiments of the invention are described in the following with reference to the drawings, which are for the purpose of illustrating the present preferred embodiments of the invention and not for the purpose of limiting the same. In the drawings.

DESCRIPTION OF PREFERRED EMBODIMENTS

Combined approaches of physical vapor deposition (catalytic inactivation pore-pattern doping) and chemical vapor deposition (CVD) are used to deterministically synthesize porous graphene films directly on catalyst substrates in a single CVD step. Deterministic synthesis implies adequate control over pore size distribution and areal density. Pore size control is accomplished via the physical vapor deposition of catalytically inactive material on a catalyst substrate followed by thermal annealing.

Figure 1:
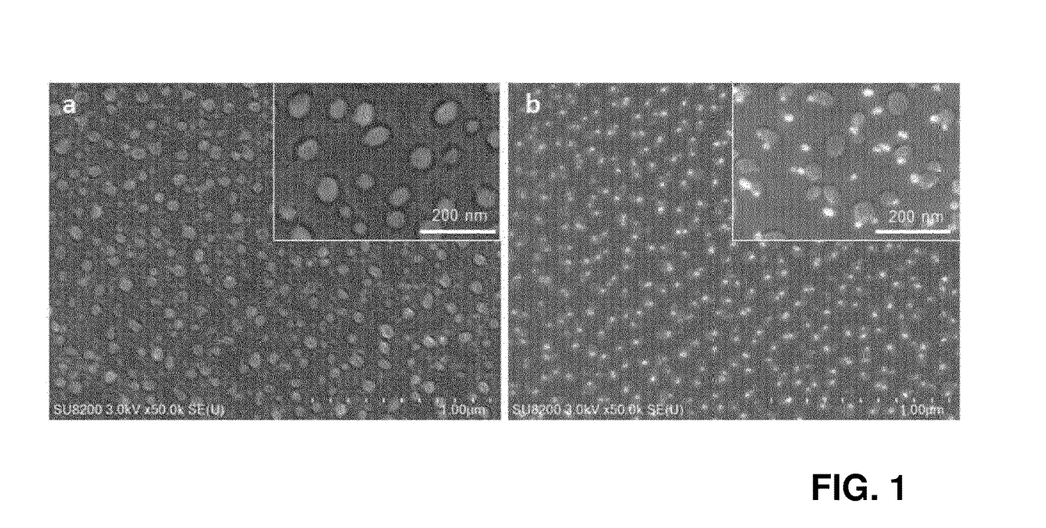
FIG. 1 shows the deposition of high-carbon solubility metal (5 nm) on copper foils, wherein in (a) as-deposited dopant metal forms islands of 40-80-nm-sized particles on copper, in (b) a thermally annealed sample in a chemically reducing environment does not change the islands but changes the crystallinity of copper more suitable for graphene growth.

Inactivation hole-patterning of catalyst substrates is used as illustrated in FIG. 1. If physical vapor deposition is lengthy or turns out to be costly, spraying catalytic inactivation material over the catalyst substrate can be considered an alternative method.

Graphene CVD is implemented on this hole-patterned catalyst substrate to produce porous graphene by growing graphene everywhere except the pattern of inactivated catalyst domains.

As-grown porous graphene is removed electrochemically or via van-der-Waals detachment or via catalyst-substrate etching. Re-use of catalyst substrates is possible.

Figure 2:
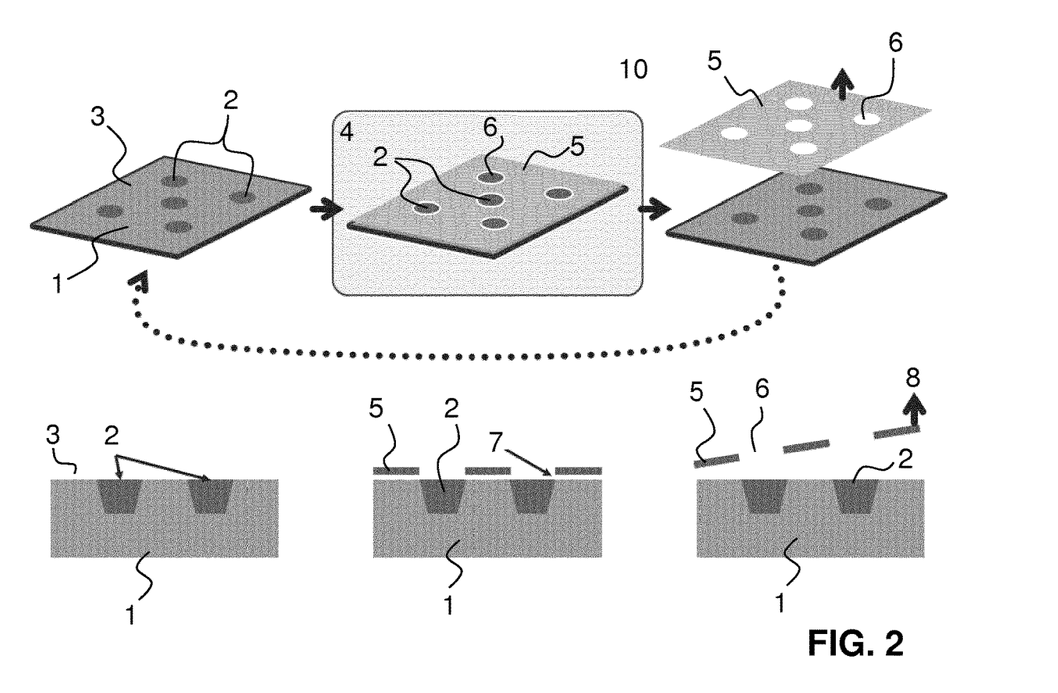
FIG. 2 shows a schematic of direct formation of porous graphene with pore (or hole) features.

A schematic of this process is illustrated in FIG. 2. A catalytic substrate in the form of a copper substrate 1 is provided with a plurality of catalytically inactive domains 2. These may either, as illustrated in the lower row of the figure, be like embedded in the substrate not altering the flat surface, but they may also be present in the form of local grains or elevations on the surface 3 of the substrate. As illustrated in the middle in a step 4 of growth of the graphene layer in a chemical vapor deposition process, graphene formation is prevented on the catalytically inactive domains 2 thus forming the pores 6, the distribution of which corresponds to the distribution of the catalytically inactive domains 2. Like this very high control over the pore size and the pore distribution of the resultant porous graphene layer 5 is possible. The graphene layer only grows up to the edges 7 at the interface between the catalytically active surface and the catalytically inactive domains 2.

As illustrated in the leftmost column of FIG. 2, showing the step 10 of removal of the porous graphene layer 5 the substrate is basically unaffected after the removal of the layer and can be reused as illustrated by arrow 9 for a subsequent production process.

Like this the synthesis and recyclable transfer of porous graphene with diameters ranging below 900 nm, and membrane thickness below 5 nm is possible with high control and high-efficiency in a one-step process.

The porous graphene membrane is manufactured using the following approaches.

(A) Preparation of a Pore-Patterned Substrate Template

As depicted in FIG. 2 a random pattern of non-catalytic doped domains 2, are formed right atop catalyst substrates 1 (copper foils). During graphene growth conditions this non-catalytic doped domain 2 forms a sacrificial metal carbide or simply remains inactive catalytically, thereby producing no graphene on it.

One of the easiest ways of producing the random holes doping pattern is to deposit the non-catalytic metal via physical vapor deposition such as sputtering or e-beam evaporation or particle spraying onto the catalytically active substrate 1. Deposition of a very small amount of material creates nucleation seeds grown later via thermal annealing to nanoparticles through surface diffusion, agglomeration and Ostwald ripening, without reaching percolation threshold.

As an example, results as shown in FIG. 1 illustrate successful formation of sub-100-nm metal nano-islands atop a copper foil. Tungsten is deposited which is prone to carbide formation or to remaining intact, instead of graphene nucleation, when exposed to carbonaceous precursor in the CVD environment. The relationship between tungsten deposition amount and thermal annealing condition can be modulated to control the particle size distribution of the metal domains, ideally between 10 and 100 nm. If tungsten were ineffective as the catalytically inactive material, other non-catalytic or carbide-forming metal species such as molybdenum, zirconium, chromium, and niobium may replace tungsten, or a deposit or a spray of gold (or other metals such as silver) nanoparticles on the copper substrate can be used alternatively.

(B) CVD Synthesis of Porous Graphene

Locally inactivated copper or tungsten-patterned copper oxide as the substrate 1 enters a CVD process to synthesize graphene atop copper yet not on the tungsten domains 2.

As the beginning step, the mixed metal layer is annealed in a dry hydrogen atmosphere to form the tungsten-patterned copper prior to the successive graphene CVD.

Graphene CVD involves feeding a sufficient amount of carbon feedstock (ethylene or acetylene) to ensure the formation of full covering of graphene atop the copper substrate.

For a textile application, it is not necessarily critical to synthesize a graphene monolayer. Bilayer, trilayer or few-layer graphene can be formed in this method with larger partial pressures of carbon feedstock.

The tungsten island domains 2 will transform to the carbide form or remain intact instead of forming graphene atop tungsten, selectively engendering "pores" amid the graphene layer.

Likewise, molybdenum, niobium, gold, silver or other suitable metallic nanoparticles can be used.

The growth kinetics and the quality of the as-grown porous graphene can be monitored by micro Raman spectroscopy (using sub-600-nm excitation wavelengths) and scanning electron microscopy (SEM). A 2D scan of the sample can produce maps of Raman G peak, G' peak, D peak, and D' peak to identify the random holey characteristic of the porous graphene. SEM can give information about the large-area connectivity of graphene. Atomic force microscopy (AFM) can also provide a surface morphology that corroborates the 2D maps of micro Raman spectroscopy.

(C) Graphene Transfer to Fabric or Other Porous Substrates

Detachment of the porous graphene layer 5 from the mixed metal layer of tungsten on copper 1 in order to reuse the metal layer to grow porous graphene again. To this end, more than three methods are possible: van der Waals peeling (Methodology A); electrochemical delamination (Methodology B); and disengagement via mechanical (e.g., ultrasonic) or thermal actuation (Methodology C).

Methodology A uses a van der Waals force to peel off the porous graphene layer from the sparsely inactivated catalyst substrate. For example, this method can employ thermal responsive tape or pressure sensitive tape to be able to detach the porous graphene from the mixed metal layer and transfer it to a mesh or fabric substrate. Upon successful transfer, thermal and pressure treatment can be used to remove the tapes from graphene. Optionally, these tapes can be coated with a two-dimensional boron nitride layer in order to augment a van der Waals interaction between graphene and boron nitride.

Methodology B employs an electrochemical reaction to generate bubbles at the graphene-metal interface to delaminate porous graphene in a clean way.

Methodology C involves mechanical and thermal actuation of the catalyst substrate (copper foil, for example) largely to disengage graphene from it. Ultrasonic activation has been widely employed to exfoliate graphene from graphite in liquid, through overcoming ca. 40 $mJ/m^2$ of the interlayer cohesive energy. Cohesion between graphene and copper can be stronger. An average cohesion energy between graphene and copper underlayer was measured as high as 6 $J/m^2$, though there is a chance for successful disengagement of graphene by combined use of sonication and surfactant. Ultrasonic actuation of graphene on copper can facilitate the electrochemical delamination (Methodology B), too. Alternatively ultrasonic actuation can be combined with mechanical knife-edge peeling in an aqueous surfactant environment. Also, rapid cooling or heating of the graphene and copper could induce a thermal expansion mismatch, of which method can be combined with the mechanical actuation options.

Experimental Examples (See in Particular Also FIGS. 3-12)

Tungsten films of several nanometers thick on top of Cu foil, W/Cu bilayer metal catalyst, were prepared by e-beam evaporation at a low chamber pressure in the range from $2.0 \times 10^{-5}$ to $3.0 \times 10^{-4}$ Pa and a low deposition rate of 0.02 Å/s.

In order to allow to synthesize holey graphene, when the base pressure reached below 0.1 Pa, two furnaces in a CVD chamber were first heated to 1050° C. to anneal W/Cu, in a mixture of 80 vol-% $H_2$ in Ar under a pressure of 40 Pa for 75 min. During annealing, thermally induced surface phenomena such as migration, agglomeration, and Ostwald ripening contribute to converting the W thin film into W nanoparticles on top of Cu.

Then, the upstream side of the furnace was decreased to 700° C. for 60 min to lower the growth rate of graphene.

Then, porous graphene was grown on W decorated Cu in a self-enclosure, or folded, form for 3 hours with 5 vol-% $CH_4$ in $H_2$ at 90 Pa. Finally, the furnaces were cooled down in Ar or $H_2$-rich Ar at a pressure of 90 Pa.

To protect porous graphene, a poly(methyl methacrylate) (PMMA) solution was applied onto the graphene/metal substrate by using a spin-coater.

The metal substrate was then removed by 0.5 M ammonium persulfate over 10 hours. The PMMA/porous graphene was rinsed with distilled water and then the floating porous graphene layer with the PMMA supporting layer was transferred onto a target substrate.

Figure 3:
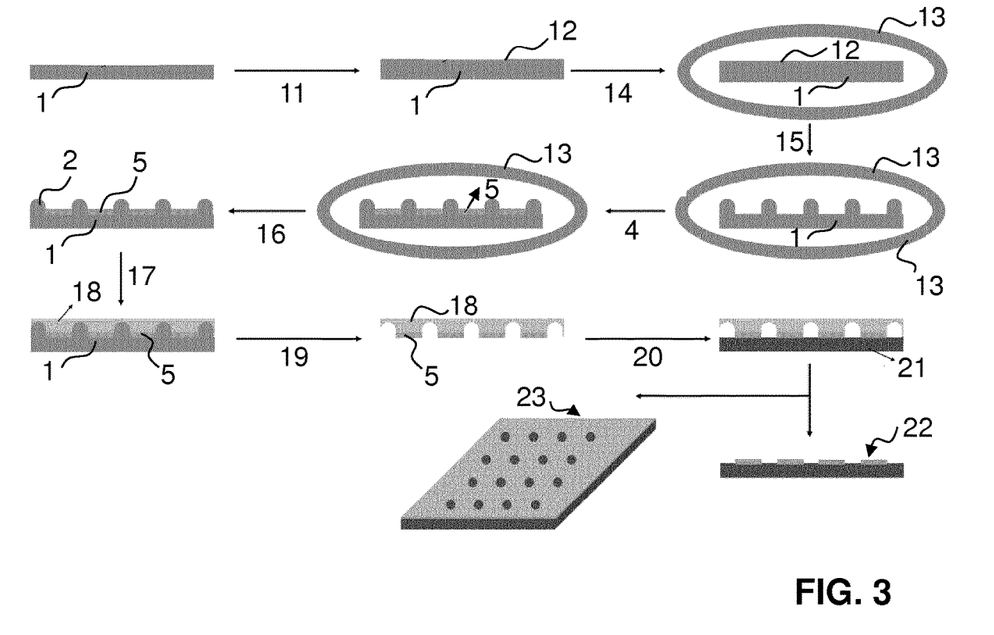
FIG. 3 shows another schematic representation of the growth procedure of porous graphene.
Figure 4:
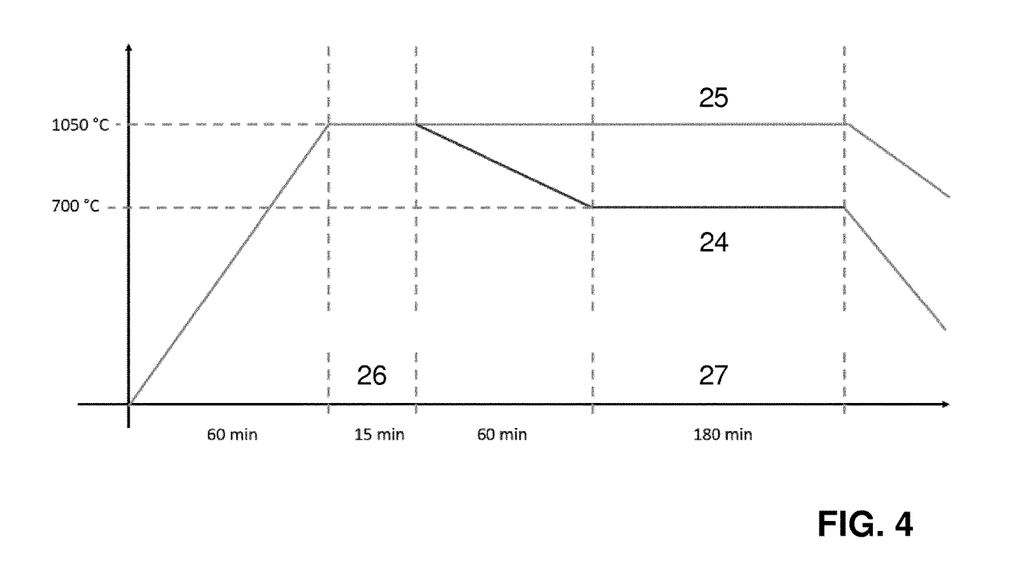
FIG. 4 shows a possible growth process of porous graphene.
Figure 5:
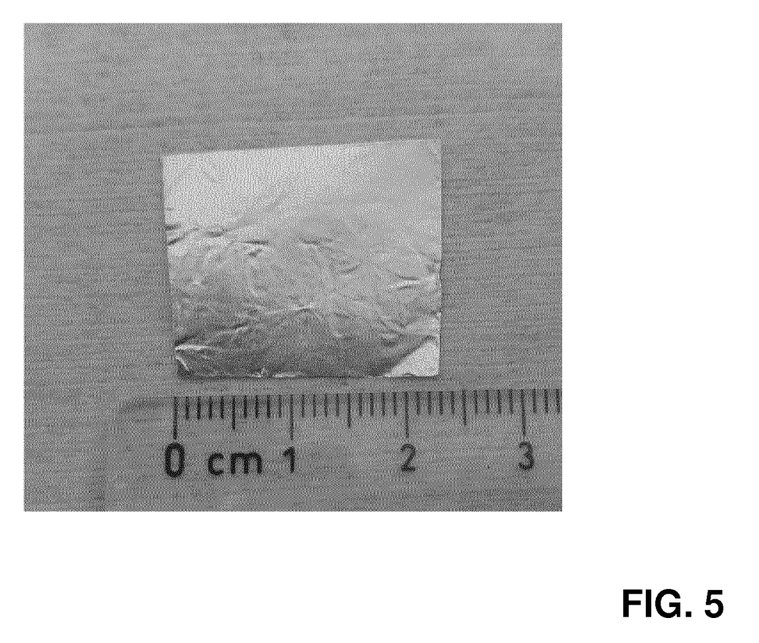
FIG. 5 shows a photograph of as grown porous graphene as large as 2×2 cm$^2$.
Figure 6:
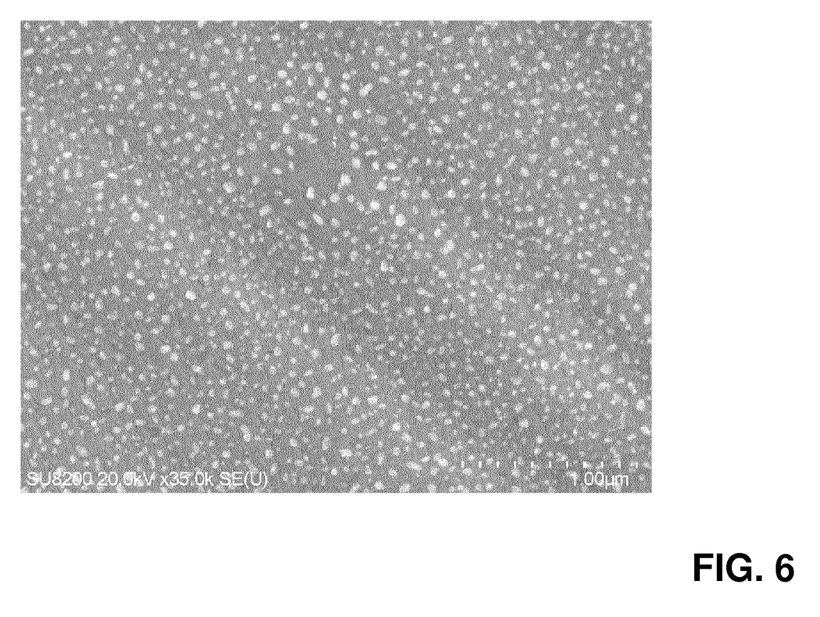
FIG. 6 shows a representative scanning electron microscope (SEM) image of W nanoparticles on Cu.
Figure 7:
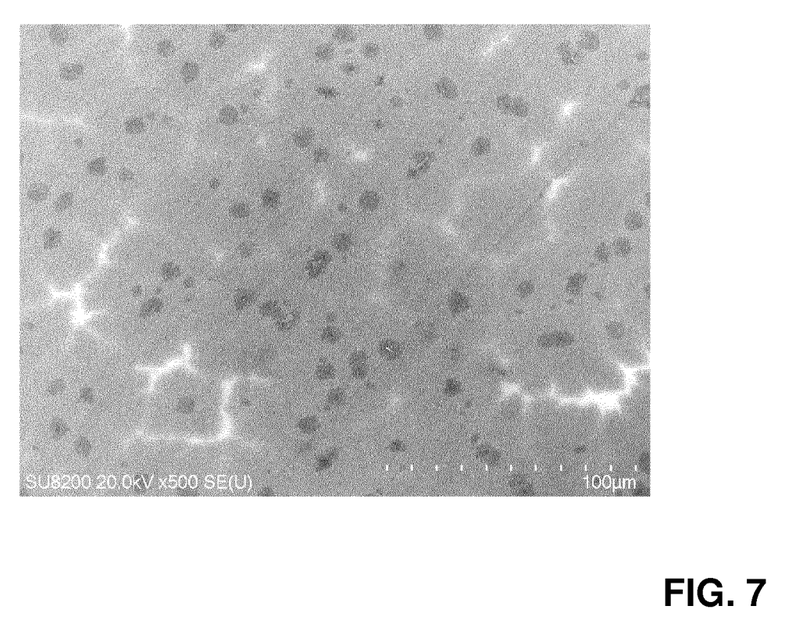
FIG. 7 shows a representative SEM image of porous graphene transferred on SiO$_2$/Si with low magnification.
Figure 8:
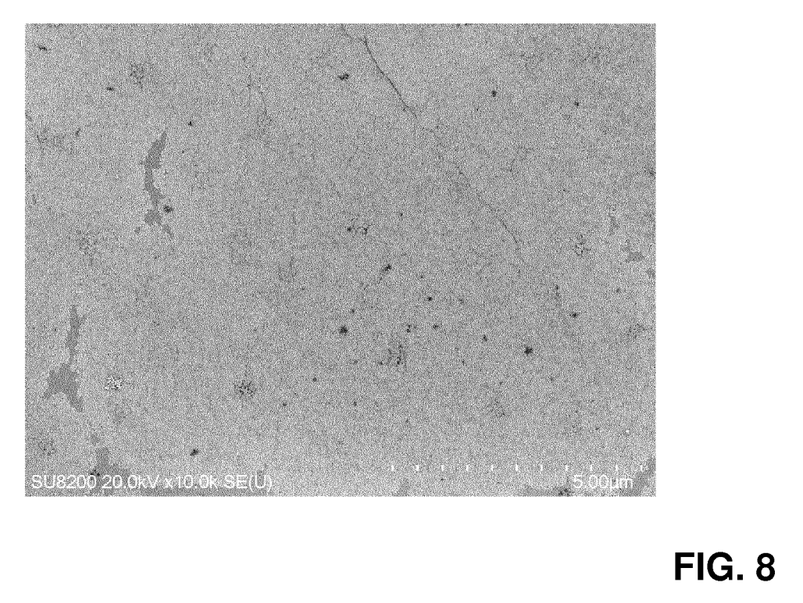
FIG. 8 shows a representative SEM image of porous graphene transferred on SiO$_2$/Si with high magnification.
Figure 9:
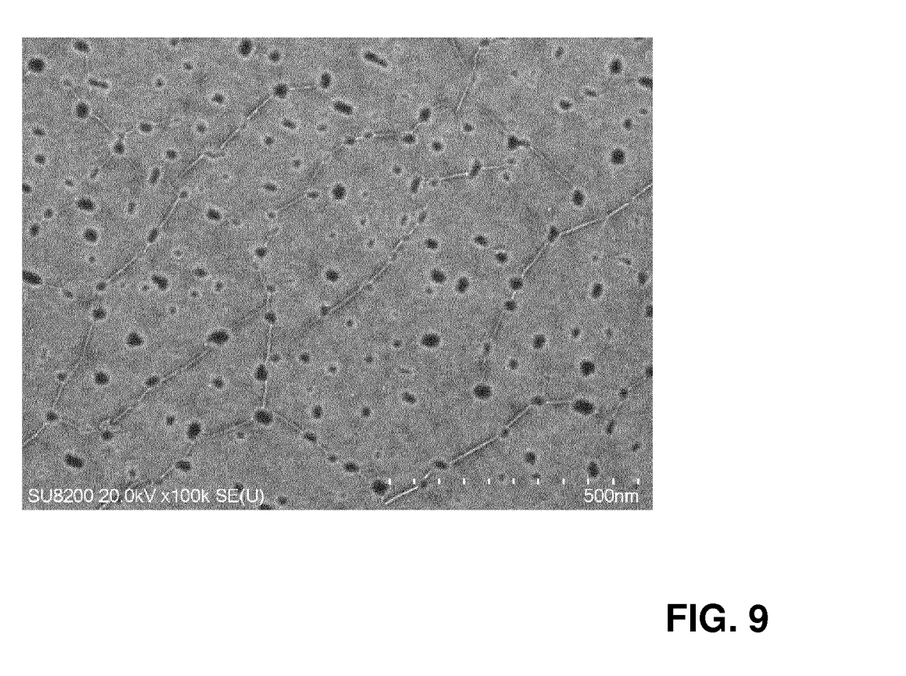
FIG. 9 shows a representative SEM image of porous graphene transferred on $SiO_2$/Si with high magnification.
Figure 10:
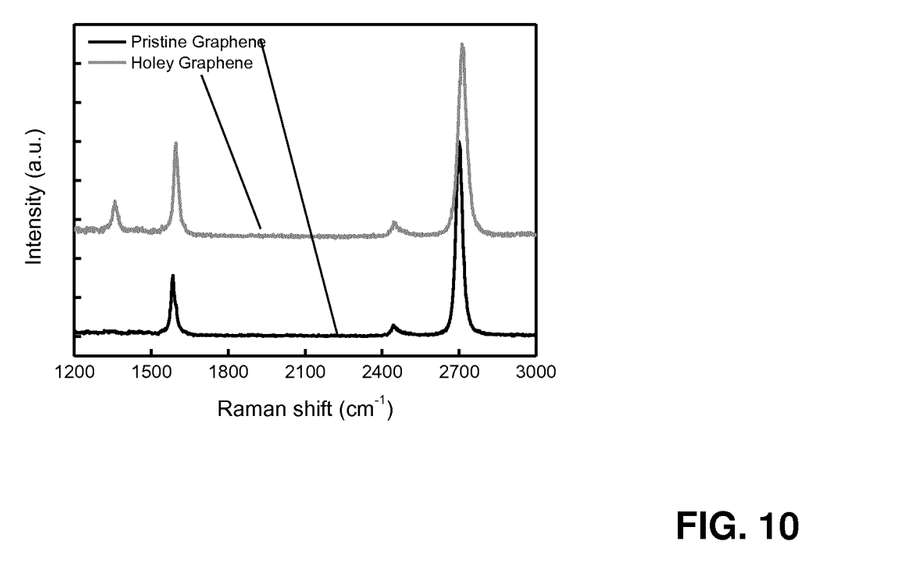
FIG. 10 shows representative Raman spectra of porous graphene and pristine graphene.
Figure 11:
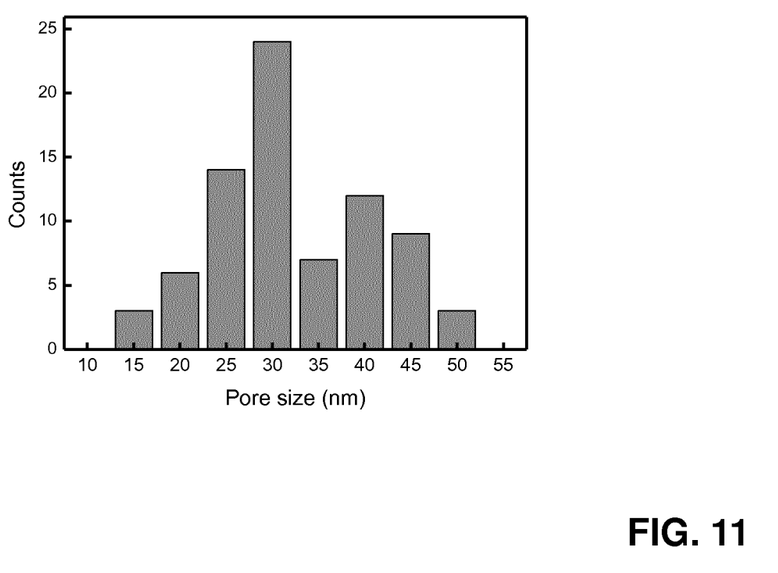
FIG. 11 shows a pore size histogram of porous graphene.
Figure 12:
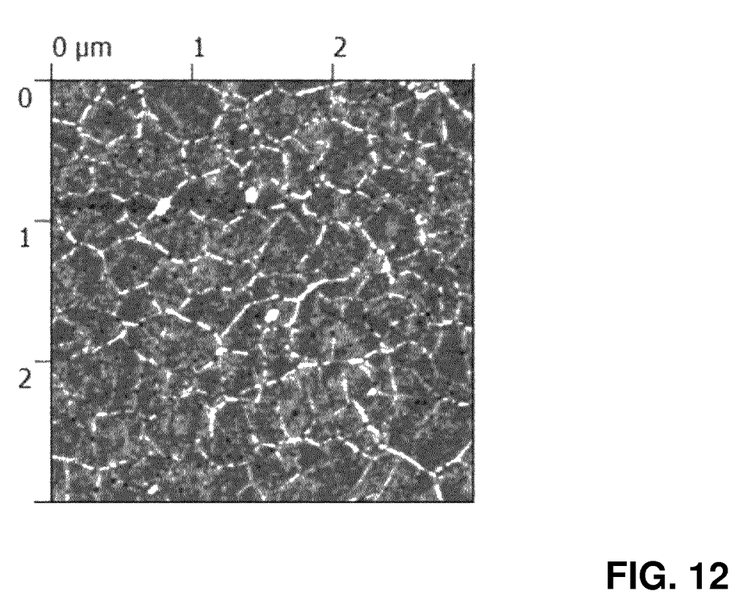
FIG. 12 shows a representative atomic force microscope (AFM) image of porous graphene.

A schematic view of the full synthesis process is illustrated in FIG. 3, and the individual stages of the process are illustrated in FIG. 4.

As-grown and transferred porous graphene were characterized by using scanning electron microscopy (SEM), atomic force microscopy (AFM), and Raman spectroscopy. Particular reference is made to FIGS. 5-12.

The average pore size is 29.2±8.5 nm (see also the characterization in FIG. 11) and the number of pores per unit area is $1.56 \times 10^{10}$ $cm^{-2}$

LIST OF REFERENCE SIGNS

| 1  | catalytic substrate, coppersubstrate |
|----|----|
| 2  | catalytically inactive domains |
| 3  | surface of substrate |
| 4  | step of growth of the graphene layer on the substrate |
| 5  | porous graphene layer |
| 6  | pore in 5 |
| 7  | edge of 6 |
| 8  | removal of 5 from 1 |
| 9  | reuse substrate |
| 10 | step of removal of porous graphene layer |
| 11 | tungsten deposition |
| 12 | contiguous tungsten film layer |
| 13 | copper enclosure |
| 14 | step of applying copper enclosure |
| 15 | step of thermal annealing |
| 16 | removal of copper enclosure |
| 17 | PMMA coating |
| 18 | PMMA coating layer |
| 19 | metal catalyst removal |
| 20 | transfer to carrier substrate |
| 21 | carrier substrate |
| 22 | cross section view |
| 23 | top view |
| 24 | furnace zone 2 |
| 25 | furnace zone 3 |
| 26 | annealing (50-90 vol-% hydrogen in a carrier gas such as argon or nitrogen) |
| 27 | growth (in 1-20 vol-% hydrocarbon feedstock) |

The invention claimed is:

1. A method for making a porous graphene layer having a thickness of less than 100 nm with pores having an average size in the range of 5-900 nm, said method comprising:
providing a catalytically active substrate to catalyze the graphene formation under chemical vapor deposition conditions, said catalytically active substrate being selected from the group consisting of the following elemental metals: Cu, Ni, Pt, Ru, Ir, Rh or a combination thereof in or on its surface being provided with a plurality of catalytically inactive domains having a size essentially corresponding to the size of the pores in the resultant porous graphene layer;
chemical vapor deposition using a carbon source in the gas phase and formation of the porous graphene layer on the surface of the catalytically active substrate, the pores in the graphene layer in situ being formed due to the presence of the catalytically inactive domains,
wherein said catalytically active substrate with a plurality of catalytically inactive domains is produced by spraying or physical vapor deposition of a catalytically inactive material selected from the group consisting of: molybdenum, tungsten, gold, silver, zirconium, niobium, chromium or a mixture/alloy thereof, or oxide systems thereof or aluminum oxide and subsequent thermal annealing to form the plurality of catalytically inactive domains, and
wherein the catalytically active substrate with the plurality of catalytically inactive domains prior to the step of chemical vapor deposition is subjected to a step of annealing in a chemically reducing hydrogen environment.

2. The method according to claim 1, wherein the catalytically active substrate is a substrate comprising an elemental metal selected from the first group consisting of Cu, Ni, Pt, Ru, Ir, Rh or a mixture thereof, and wherein the catalytically inactive domains are due to the presence of a metal different from said first group in said domains.

3. The method according to claim 1, wherein the catalytically inactive domains have an average size between 5-900 nm.

4. The method according to claim 1, wherein the porous graphene layer has a thickness of less than 50 nm.

5. The method according to claim 1, wherein subsequent to the chemical vapor deposition of the porous graphene layer, the porous graphene layer is removed from the substrate, and subsequent transfer to another substrate.

6. The method according to claim 5, wherein a delaminated porous graphene layer is subsequently attached to a porous substrate on one or both sides of the porous graphene membrane.

7. The method according to claim 5, wherein the substrate is reused for a next manufacturing process of the porous graphene layer.

8. The method according to claim 1, wherein the method is a continuous or a batch process.

9. The method according to claim 1, wherein the pores have an average size of 10-500 nm.

10. The method according to claim 1, wherein, in the step of chemical vapor deposition,
the carbon source is provided as a flow mixture of hydrocarbon and hydrogen at a volumetric ratio of 1-1000 parts hydrocarbon per part of hydrogen.

11. The method according to claim 1, wherein, for the making of the substrate on a catalytically active substrate, a metal layer is produced using a metal which is not catalytically active,
then, after the pressure is lowered to baseline values at or below 0.0002 Pa, the substrate is first heated to a temperature in the range of 900-1200° C. to anneal in a chemically reducing environment for a time span in the range of 30-120 minutes.

12. Use of a porous graphene layer as produced using the method according to claim 1 as a waterproof and highly breathable membrane for textile applications; water barrier membranes; pressure equalizer membranes for electronics including cell phones and handheld devices; filters; gas separation membranes; and electronic components for conductive, semi-conductive or electricity generating applications.

13. A porous graphene layer as produced using the method according to claim 1, with a thickness of less than 100 nm and with the pores having an average size of 5-900 nm.

14. The method according to claim 1, wherein the catalytically active substrate with the plurality of catalytically inactive domains prior to the step of chemical vapor deposition is subjected to a step of annealing in a chemically reducing hydrogen environment.

15. The method according to claim 1, wherein the catalytically active substrate is furnished with a plurality of catalytically inactive domains subjected to a step of annealing in a chemically reducing environment, in hydrogen, prior to the step of chemical vapor deposition.

16. The method according to claim 1, wherein the catalytically active substrate with the plurality of catalytically inactive domains prior to the step of chemical vapor deposition is subjected to a step of annealing in a chemically reducing hydrogen environment, and wherein conditions for this annealing are chosen as follows: 50-90 vol-% $H_2$, in an inactive carrier gas, including inert gases including Ar, He and Ne or $N_2$, at a temperature of 900-1200° C., for a time span of 30-120 minutes.

17. The method according to claim 1, wherein the catalytically active substrate with the plurality of catalytically inactive domains prior to the step of chemical vapor deposition is subjected to a step of annealing in a chemically reducing hydrogen environment, and wherein conditions for this annealing are chosen as follows: 70-85 vol-% $H_2$, in an inactive carrier gas selected from the group consisting of Ar, He, Ne, $N_2$, and mixtures thereof, at a temperature of 950-1100° C., at a pressure of 1 to 100000 Pa for a time span of 30-120 minutes.

18. The method according to claim 1, wherein the catalytically active substrate with the plurality of catalytically inactive domains prior to the step of chemical vapor deposition is subjected to a step of annealing in a chemically reducing hydrogen environment, and wherein conditions for this annealing are chosen as follows: 70-85 vol-% $H_2$, in an inactive carrier gas, at a temperature of 950-1100° C., at a pressure of 10-100 Pa for a time span of 60-90 minutes.

19. The method according to claim 1, wherein said catalytically active substrate with a plurality of catalytically inactive domains is produced by spraying or physical vapor deposition, in the form of sputtering, e-beam evaporation or particle spraying, of a catalytically inactive material or of a material catalytically inactivating the substrate and subsequent thermal annealing to form the plurality of catalytically inactive domains.

20. The method according to claim 1, wherein the catalytically inactive domains have an average size of 10-100 nm.

21. The method according to claim 1, wherein the catalytically inactive domains have an average size of 10-50 nm.

22. The method according to claim 1, wherein the porous graphene layer has a thickness of less than 50 nm and wherein the catalytically inactive domains have an average size of 10-50 nm.

23. The method according to claim 1, wherein the porous graphene layer has a thickness of less than 20 nm.

24. The method according to claim 1, wherein the porous graphene layer has a thickness of less than 10 nm.

25. The method according to claim 1, wherein the porous graphene layer has a thickness of less than 5 nm.

26. The method according to claim 1, wherein subsequent to the chemical vapor deposition of the porous graphene layer, the porous graphene layer is removed from the substrate, using at least one of a mechanical and an electrochemical method, electrochemical delamination, or disengagement by mechanical actuation, including ultrasonic actuation or thermal actuation, and subsequent transfer to another substrate.

27. The method according to claim 1, wherein subsequent to the chemical vapor deposition of the porous graphene layer, the porous graphene layer is removed from the substrate via van der Waals peeling, and subsequent transfer to another substrate.

28. The method according to claim 5, wherein delaminated porous graphene layer is subsequently attached to a porous substrate on one or both sides of the porous graphene membrane, wherein the porous substrate is selected from the group of: fabric of woven, non-woven or knit construction, and metal or ceramic mesh, or foam.

29. The method according to claim 1, wherein the pores have an average size of 20-100 nm.

30. The method according to claim 1, wherein a density of the pores is $0.1\text{-}100\times10^{10}$ $cm^{-2}$.

31. The method according to claim 1, wherein a density of the pores is $0.1\text{-}500\times10^{10}$ cm$^{-2}$.

32. The method according to claim 1, wherein a density of the pores is $0.5\text{-}150\times10^{10}$ cm$^{-2}$.

33. The method according to claim 1, wherein a density of the pores is $1\text{-}10\times10^{10}$ cm$^{-2}$.

34. The method according to claim 1, wherein, in the step of chemical vapor deposition,
the carbon source chosen to be saturated or unsaturated hydrocarbons is provided as a flow mixture of hydrocarbon and hydrogen at a volumetric ratio of 1-1000 parts hydrocarbon per part of hydrogen.

35. The method according to claim 1, wherein, in the step of chemical vapor deposition,
the carbon source, chosen to be methane, ethane, ethylene, acetylene and mixtures thereof, is provided as a flow mixture of hydrocarbon and hydrogen at a volumetric ratio of 1-10 parts hydrocarbon per part of hydrogen.

36. The method according to claim 1, wherein, in the step of chemical vapor deposition,
the carbon source, chosen to be methane, ethane, ethylene, acetylene and mixtures thereof, is provided as a flow mixture of hydrocarbon and hydrogen at a volumetric ratio of 1-10 parts hydrocarbon per part of hydrogen, and wherein the hydrocarbon and hydrogen gases are mixed with a carrier gas including argon or nitrogen or are used at 1-20 vol-% in concentration mixed with hydrogen at an overall pressure in the range of 10-10000 Pa.

37. The method according to claim 1, wherein, in the step of chemical vapor deposition,
the carbon source, chosen to be methane, ethane, ethylene, acetylene and mixtures thereof, is provided as a flow mixture of hydrocarbon and hydrogen at a volumetric ratio of 600-800 parts hydrocarbon per part of hydrogen, wherein the hydrocarbon and hydrogen gases are mixed with a carrier gas including argon or nitrogen or are used at 1-20 vol-% in concentration mixed with hydrogen at an overall pressure in the range of 10-200 or 80-120 Pa, and wherein a CVD process is carried out at a temperature of 300-1200° C., for a time span of 1-12 hours.

38. The method according to claim 1, wherein, in the step of chemical vapor deposition,
the carbon source, chosen to be methane, ethane, ethylene, acetylene and mixtures thereof, is provided as a flow mixture of hydrocarbon and hydrogen at a volumetric ratio of 1-20, wherein a CVD process is carried out at a temperature of 300-800° C. for a time span of 2-4 hours.

39. The method according to claim 1, wherein, for making of the substrate on a catalytically active substrate in the form of a copper foil, a metal layer is produced using tungsten metal which is not catalytically active, and wherein such a contiguous layer which is 1-10 nm thick is in a first step produced via physical vapor deposition at a chamber pressure from $2.0\times10^{-5}$ to $3.0\times10^{-4}$ Pa.

40. The method according to claim 1, wherein, for making of the substrate on a catalytically active substrate in the form of a copper foil, a metal layer is produced using tungsten metal which is not catalytically active, wherein such a contiguous layer which is 1-10 nm thick is in a first step produced via physical vapor deposition at a chamber pressure from $2.0\times10^{-5}$ to $3.0\times10^{-4}$ Pa, and wherein a deposition rate of 0.01-1.0 Å/s is used.

41. A porous graphene layer as produced using the method according to claim 1, with a thickness of less than 100 nm and with the pores having an average size of 5-900 nm for use as a waterproof and highly breathable membrane for textile applications; barrier membranes or pressure equalizer membranes for electronics including cell phones and handheld devices; filters; gas separation membranes; electronic components for conductive, semi-conductive and/or electricity generating applications.

42. A method for making a porous graphene layer having a thickness of less than 100 nm with pores having an average size in the range of 5-900 nm, said method comprising:
providing a catalytically active substrate to catalyze the graphene formation under chemical vapor deposition conditions, said catalytically active substrate comprising an elemental metal selected from a first group consisting of the following elemental metals: Cu, Ni, Pt, Ru, Ir, Rh or a combination thereof in or on its surface being provided with a plurality of catalytically inactive domains having a size essentially corresponding to the size of the pores in the resultant porous graphene layer;
chemical vapor deposition using a carbon source in the gas phase and formation of the porous graphene layer on the surface of the catalytically active substrate, the pores in the graphene layer in situ being formed due to the presence of the catalytically inactive domains,
wherein said catalytically active substrate with a plurality of catalytically inactive domains is produced by spraying or physical vapor deposition of a catalytically inactive material of a metal different from said first group selected from a second group consisting of: molybdenum, tungsten, gold, silver, zirconium, niobium, chromium or a mixture/alloy thereof, or oxide systems thereof or aluminum oxide and subsequent thermal annealing to form the plurality of catalytically inactive domains, and
wherein the catalytically active substrate with the plurality of catalytically inactive domains prior to the step of chemical vapor deposition is subjected to a step of annealing in a chemically reducing hydrogen environment.

\* \* \* \* \*